United States Patent [19]

Matsumura et al.

[11] Patent Number: 5,365,475
[45] Date of Patent: Nov. 15, 1994

[54] SEMICONDUCTOR MEMORY DEVICE USABLE AS STATIC TYPE MEMORY AND READ-ONLY MEMORY AND OPERATING METHOD THEREFOR

[75] Inventors: Tetsuya Matsumura; Shinichi Uramoto; Masahiko Yoshimoto, all of Hyogo, Japan

[73] Assignee: Mitsubishi Denki Kabushiki Kaisha, Tokyo, Japan

[21] Appl. No.: 747,204

[22] Filed: Aug. 19, 1991

[30] Foreign Application Priority Data

Aug. 31, 1990 [JP] Japan ................. 2-231644

[51] Int. Cl.$^5$ ............................................. G11C 11/00
[52] U.S. Cl. ........................... 365/154; 365/104; 365/156
[58] Field of Search ............ 365/187.11, 154, 94, 365/95, 104, 182, 156

[56] References Cited

U.S. PATENT DOCUMENTS

| 3,753,242 | 8/1973 | Townsend | 365/94 |
| 4,855,803 | 8/1989 | Azumai et al. | 365/154 |
| 5,204,990 | 4/1993 | Blake et al. | 365/154 |

FOREIGN PATENT DOCUMENTS

| 60-79597 | 5/1985 | Japan . |
| 61-3395 | 1/1986 | Japan . |
| 1-130395 | 5/1989 | Japan . |

Primary Examiner—Eugene R. LaRoche
Assistant Examiner—Son Dinh
Attorney, Agent, or Firm—Lowe, Price, LeBlanc & Becker

[57] ABSTRACT

Each of memory cells of a semiconductor memory device comprises a transistor connected between a node and a node, a transistor connected between the node and a node, a transistor connected between a node and a node, and a transistor connected between node and a node. Each of the nodes is connected to either of a first potential line and a second supply line in a program unit when it is manufactured, and each of the nodes is connected to either of the first and the second ground lines in a program unit when it is manufactured.

A supply potential is supplied to the first supply line, and the supply potential or the ground potential is selectively supplied to the second supply line. The ground potential is supplied to the first ground line, and the ground potential or the supply potential is selectively supplied to the second ground line.

27 Claims, 22 Drawing Sheets ( A TYPE )

( B TYPE )

( B TYPE )

( C TYPE )

( C TYPE )

( D TYPE )

( D TYPE )

( D TYPE )

( D TYPE )

FIG. 8A

| CASE | POTENTIALS AT SECOND SUPPLY LINE AND SECOND GROUND LINE | | TYPE OF MEMORY CELL | | | |
|---|---|---|---|---|---|---|
| | $V_2$ | $G_2$ | A TYPE | B TYPE | C TYPE | D TYPE |
| (1) | H | L | RAM CELL | RAM CELL | RAM CELL | RAM CELL |
| (2) | H | H | RAM CELL | FIRST ROM CELL | RAM CELL | FIRST ROM CELL |
| (3) | L | L | RAM CELL | RAM CELL | SECOND ROM CELL | SECOND ROM CELL |
| (4) | L | H | RAM CELL | FIRST ROM CELL | SECOND ROM CELL | — |

FIG. 8B

| V2 | G2 | B TYPE MEMORY CELLS |
|---|---|---|
| H | L | SRAM |
| L | H | |
| H | H | ROM { FIG.5A → "0" |
| L | H |        FIG.5B → "1" |

FIG. 8C

| V2 | G2 | C TYPE MEMORY CELLS |
|---|---|---|
| H | L | SRAM |
| H | H | |
| L | L | ROM { FIG.6A → "1" |
| L | H |        FIG.6B → "0" |

FIG. 8D

| V2 | G2 | D TYPE MEMORY CELLS |
|---|---|---|
| H | L | SRAM |
| H | H | 1ST ROM { FIG.7A → "0"<br>FIG.7B → "1"<br>FIG.7C → "0"<br>FIG.7D → "1" |
| L | L | 2ND ROM { FIG.7A → "0"<br>FIG.7B → "0"<br>FIG.7C → "1"<br>FIG.7D → "1" |

SEMICONDUCTOR MEMORY DEVICE USABLE AS STATIC TYPE MEMORY AND READ-ONLY MEMORY AND OPERATING METHOD THEREFOR

CROSS-REFERENCE TO RELATED APPLICATION

The present application is related to a copending application Ser. No. 526,138, filed May 22, 1990, commonly assigned with the present invention.

BACKGROUND OF THE INVENTION

1. Field of the Invention

The present invention relates to semiconductor memory devices, and particularly to a semiconductor memory device which is usable as both a static type memory and a read-only memory and a method of operating the same.

2. Description of the Background Art

FIG. 16 is a block diagram showing a structure of a conventional and general static random access memory (hereinafter referred to as SRAM).

In a memory cell array 1a, a plurality of word lines WL and a plurality of bit line pairs BL, $\overline{BL}$ are arranged so as to cross each other, and memory cells 2a are provided on their crossings. Then, a power supply potential (hereinafter referred to a supply potential) Vcc is supplied by a supply line 3, and the ground potential GND (0 V) is supplied by a ground line 4 to memory cell array 1a.

A row decoder 5, a column decoder 6, and an input/output circuit 8 are provided in relation to memory cell array 1a. Row decoder 5 decodes the row address signal of the address signal AD supplied through an address input line 7, selects one of the plurality of word lines WL, and provides a voltage of a high level or "H" corresponding to the supply potential Vcc to the selected word line WL. Input/output circuit 8 includes a plurality of switching circuits provided on each of bit line pairs BL, $\overline{BL}$ and one sense amplifier or a plurality of sense amplifiers provided between a data input/output line 9 and each switching circuit. Column decoder 6 decodes the column address signal of the address signal AD supplied through address input line 7, selects one of the plurality of switching circuits in input/output circuit 8, and renders the selected switching circuit in conducting state.

Thus, one of the plurality of memory cells 2a is selected by row decoder 5 and column decoder 6. When data is written, the externally provided data D is written in the selected memory cell 2a selected through data input/output line 9 and input/output circuit 8. When data is read, the data stored in the selected memory cell 2a is read to the outside through data input/output circuit 8 and data input/output line 9.

FIG. 17 is a circuit diagram showing the structure of the memory cell 2a shown in FIG. 16.

Memory cell 2a includes P channel MOS transistors 21, 22 and N channel MOS transistors 23, 24, 25, and 26. Transistor 21 is connected between a node N1 and a node NA and transistor 23 is connected between node NA and a node N3. Transistor 22 is connected between node N2 and a node NB, and transistor 24 is connected between node NB and N4. The gates of the transistors 21, 23 are connected to node NB, and the gates of transistors 22, 24 are connected to node NA. Nodes N1, N2 are connected to supply line 3 and nodes N3, N4 are connected to ground line 4. Transistors 21, 23 constitute a first inverter, and transistors 22, 24 constitute a second inverter. Potential which are complementary to each other are provided to node NA and NB.

Transistor 25 is connected between bit line BL and node NA, and transistor 26 is connected between bit line $\overline{BL}$ and node NB. The gates of transistors 25, 26 are connected to word line WL. The memory cell 2a shown in FIG. 17 is refereed to as a CMOS type memory cell.

Now, the write operation of the memory cell 2a shown in FIG. 17 will be described.

The data externally provided is supplied through data input/output line 9 and input/output circuit 8 to bit line pair BL, $\overline{BL}$. When the data "1" is written, the potential at bit line BL becomes "H", and the potential at bit line $\overline{BL}$ becomes a low level or "L". When a word line WL is selected by row decoder 5, the potential at this word line WL rises to "H". As a result, transistors 25, 26 turn on. Consequently, the potential at node NA becomes "H", and the potential at node NB becomes "L". As a result, transistor 24 turns on, and transistor 22 turns off. Then, transistor 21 turns on, and transistor 23 turns off. Therefore, the potential at node NA is pulled up through transistor 21 to the supply potential, and the potential at node NB is pulled down through transistor 24 to the ground potential. Thus, the data "1" is stored in memory cell 2a.

When the data "0" is written, an operation opposite to the above described operation is performed.

Now, the write operation of the memory cell 2a shown in FIG. 17 will be described.

First, when a word line WL is selected by row decoder 5, the potential at the word line WL rises to "H". As a result, transistors 25, 26 turn on, and the potentials held at node NA and NB are transferred to bit line BL and $\overline{BL}$, respectively. In the case where the data "1" is stored in memory cell 2a, the potential at bit line BL becomes "H", and the potential at bit line $\overline{BL}$ becomes "L". Conversely, in the case where data "0" is stored in memory cell 2a, the potential at bit line BL becomes "L", and the potential at bit line $\overline{BL}$ becomes "H".

Thus, the data read out to bit line pair BL, $\overline{BL}$ is supplied to the outside as an output through input/output circuit 8 and data input/output line 9.

Thus, memory cell 2a in FIG. 17 operates as a static type memory cell. Therefore, even if each memory cell is not periodically refreshed in the SRAM in FIG. 16 as in Dynamic Random Access Memory (DRAM), each memory cell 2a can statically store data as long as the supply potential Vcc is provided to supply line 3.

In the conventional SRAM described above, however, if the supply potential Vcc is stopped from being supplied to supply line 3, the data stored in each memory cell 2a is lost. More specifically, in a conventional SRAM, it is impossible to fixedly store data as in a read-only memory (hereinafter referred to as ROM). In accordance with diversification of systems in recent years, semiconductor memory devices of multifunction came to be demanded, and implementation of semiconductor memory devices having both the functions of SRAM and ROM is strongly demanded.

Therefore, a semiconductor memory device having both the functions of SRAM and ROM has been developed by the inventors of the present application.

FIG. 18 is a block diagram which shows a structure of a conventional semiconductor memory device having both the functions of SRAM and ROM. This semiconductor memory device is disclosed in Patent Laying Open No. Hei 1-130395 and the corresponding U.S. Ser. No. 526,138.

A plurality of word lines WL and a plurality of bit line pairs, Bl, $\overline{BL}$ are arranged in a memory cell array 1b so as to cross each other, and memory cells 2b are provided at the crossings of them. A first potential Vcc1 is supplied through a first supply line 31, a second potential Vcc2 is supplied through a second supply line 32, and a ground potential GND is supplied through ground line 4 to memory cell array 1b. The other parts of the structure are the same as the structure of the semiconductor memory device in FIG. 16.

FIG. 19 is a circuit diagram which shows the structure of memory cell 2b shown in FIG. 18.

In Memory cell 2b, high resistance load devices 21a, 22a are provided instead of transistors 21, 22 in memory cell 2a in FIG. 17. High resistance load device 21a is connected between node N1 and node NA, and high resistance load device 22a is connected between node N2 and node NB. Node N1 is connected to first supply line 31, and node N2 is connected to second supply line 32. This memory cell 2b is referred to as a high resistance load type memory cell.

Now, the operation of the memory cell 2b shown in FIG. 19 will be described.

First, if potentials Vcc1 and Vcc2 are set to the supply potential Vcc, memory cell 2b operates as an ordinary static type memory cell like the memory cell 2a in FIG. 17.

Then, if potential Vcc1 is set to the supply potential Vcc and potential Vcc2 is set to the ground potential, the potentials at nodes N2, NB become "L". Therefore, transistor 23 turns off. Accordingly, the potential at node NA is pulled up to the supply potential Vcc. As a result, transistor 24 turns on. Therefore, the potential at node NB is pulled down to the ground potential. Specifically, this memory cell 2b comes to fixedly store the data "1". In this case, memory cell 2b operates as a ROM cell storing the data "1".

Conversely, if potential Vcc1 is set to the ground potential and potential Vcc2 is set to the supply potential Vcc, memory cell 2b makes an operation opposite to the above described operation. Specifically, this memory cell 2b fixedly stores the data "0". In this case, memory cell 2b operates as a ROM cell storing the data "0".

If potentials Vcc1 and Vcc2 are set to the ground potential GND, both the potentials at nodes NA, NB become "L". Therefore, it is impossible to specify the data to be stored in memory cell 2b.

As described above, according to the semiconductor memory device shown in FIGS. 18 and 19, the semiconductor memory device can be used as any of SRAM and ROM, as per the potentials provided to first and second supply lines 31, 32.

However, either of the two supply lines 31, 32 is normally used to provide the supply potential Vcc to the whole of the semiconductor memory device. In the case where first supply line 31 is used for providing the supply potential Vcc to the whole of the semiconductor memory device, a user can use the semiconductor memory device as SRAM or ROM by setting potential Vcc2, which is fed to second supply line 32, to provide potential Vcc or ground potential GND.

In this case, if potential Vcc2 is set to the supply potential Vcc, memory cell 2b operates as a static type memory cell. Moreover, if potential Vcc2 is set to the ground potential GND, memory cell 2b operates as ROM cell storing the data "1". In this case, however, memory cell 2b cannot be used as a ROM cell storing the data "0".

Thus, it is difficult for a user to use memory cell 2b as a ROM storing any data.

SUMMARY OF THE INVENTION

One object of the present invention is to expand application of semiconductor devices.

Another object of the present invention is to provide a semiconductor memory device usable as SRAM and as a ROM (two-phase ROM) storing any data.

Yet another object of the present invention is to provide a method of operation which makes it possible to use a semiconductor memory device as a SRAM and a two-phase ROM.

The semiconductor memory device according to the present invention comprises a first potential line receiving a first potential, a second potential line receiving a second potential, a third potential line selectively receiving the first potential or the second potential, a fourth potential line selectively receiving the first potential or the second potential, and at least one memory cell.

The memory cell includes a first node and a second node provided with potential which are complementary to each other, a first pull-up/pull-down device connected between either the first potential line or the third potential line and the first node, a second pull-up/pull-down device connected between either the first potential line or the third potential line and the second node, a third pull-up/pull-down device connected between either the second potential line or the fourth potential line and the first node, and a fourth pull-up/pull-down device connected between either the second potential line or the fourth potential line and the second node.

In the semiconductor memory device, a plurality of memory cells can be obtained, depending on whether the first and the second pull-up/pull-down devices are connected to the first potential or the third potential line and whether the third and the fourth pull-up/pull-down devices are connected to the second potential line or the fourth potential line when it is manufactured.

Moreover, the memory cell operates as either a static type memory cell or a read-only memory cell fixedly storing any data, depending on whether the first potential or the second potential is provided to the third potential line and whether the first potential or the second potential is provided to the fourth potential line when it is used.

Thus, it is possible to use the semiconductor memory device as a SRAM or a two-phase ROM fixedly storing any data by selectively providing the first potential or the second potential to each of the third potential line and the fourth potential line. Therefore, a semiconductor memory device of wide application can be obtained.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8A is a diagram for explaining the operation of each type of memory cells.

FIGS. 8B, 8C and 8D respectively show states of B type memory cells, C type memory cells and D type memory cells depending on potentials supplied to second supply line and second ground line.

DESCRIPTION OF THE PREFERRED EMBODIMENTS

Figure 1:
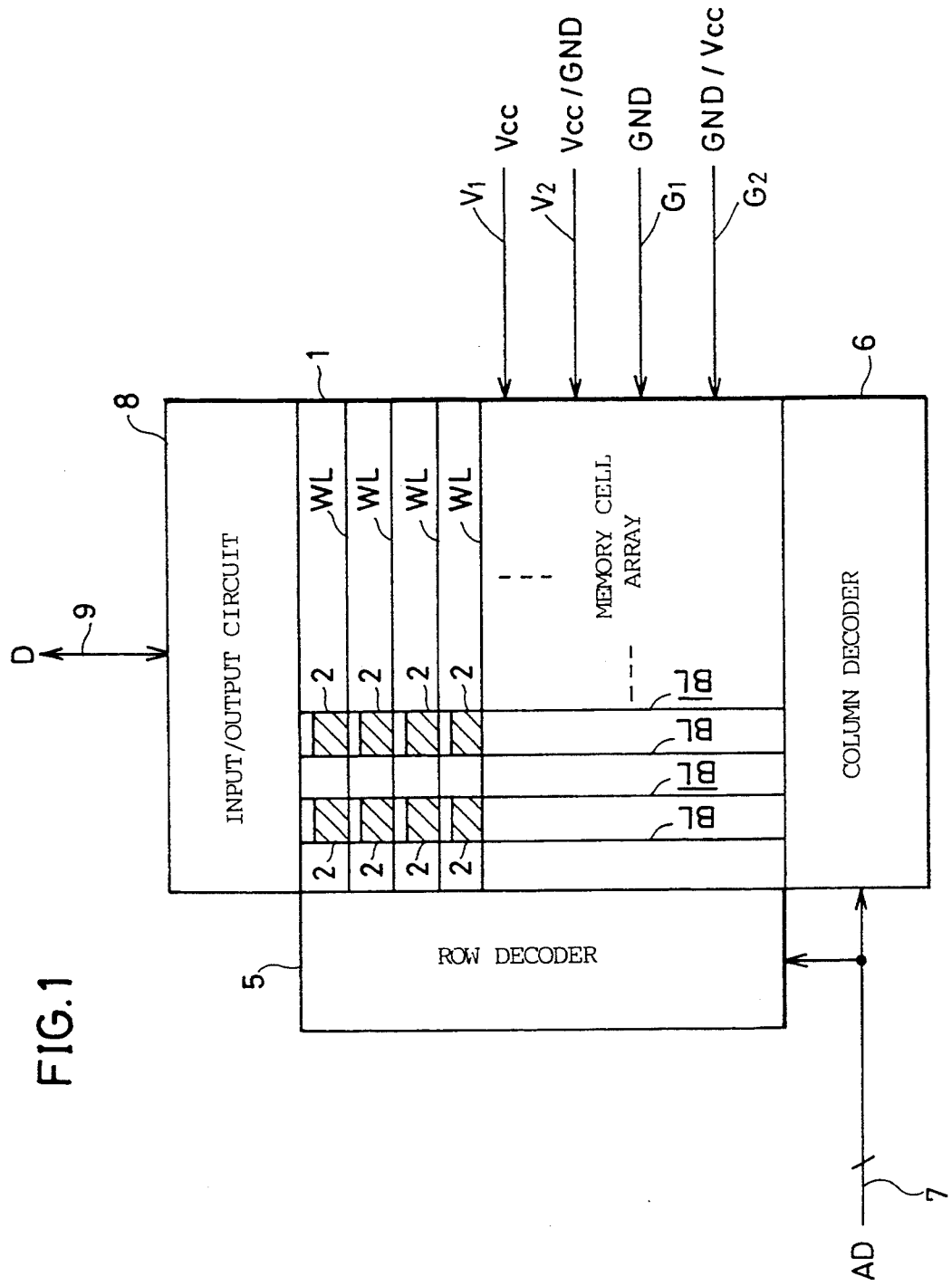
FIG. 1 is a block diagram showing the whole structure of the semiconductor memory device according to one embodiment of the present invention.

In FIG. 1, a plurality of word lines WL and a plurality of bit line pairs BL, $\overline{BL}$ are arranged so as to cross each other in memory cell array 1, and a memory cell 2 is provided at each of their crossings. First and second supply lines V1, V2 and first and second ground lines G1, G2 are connected to memory cell array 1. A supply potential Vcc is supplied to first supply line V1, and a supply potential Vcc or the ground potential GND (0 V) is selectively supplied to second supply line V2 by a user. The ground potential GND is supplied to first ground line G1, and the ground potential GND or the supply potential Vcc is selectively supplied to second ground line G2 by a user.

Figure 2A:
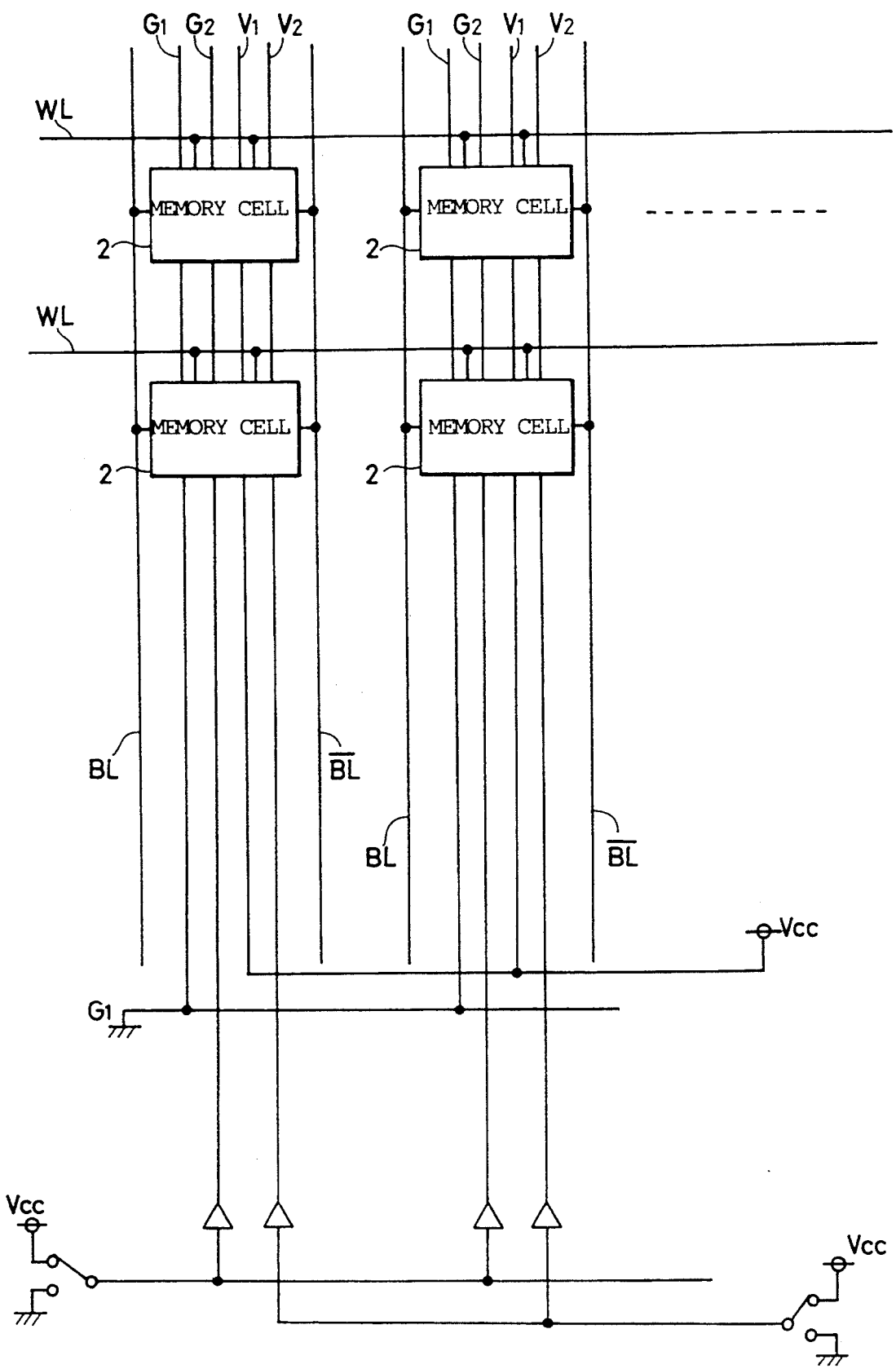
FIG. 2A is a diagram showing the structure of the memory cell array of the semiconductor memory device shown in FIG. 1.

As shown in FIG. 2A, first and second supply lines V1, V2 and first and second ground lines G1, G2 are arranged so as to vertically cross memory cells 2 in each column, and the word lines connected to each memory cell in each column.

First supply line V1 and first ground line G1 are used to supply the supply potential Vcc and the ground potential GND, respectively, to the whole semiconductor memory device. Moreover, second supply line V2 and second ground line G2 are used to select the state of each memory cell 2. First supply line V1 corresponds to the first potential line, second supply line V2 corresponds to the third potential line, first ground line G1 corresponds to the second potential line, and second ground line G2 corresponds to the fourth potential line.

Figure 2B:
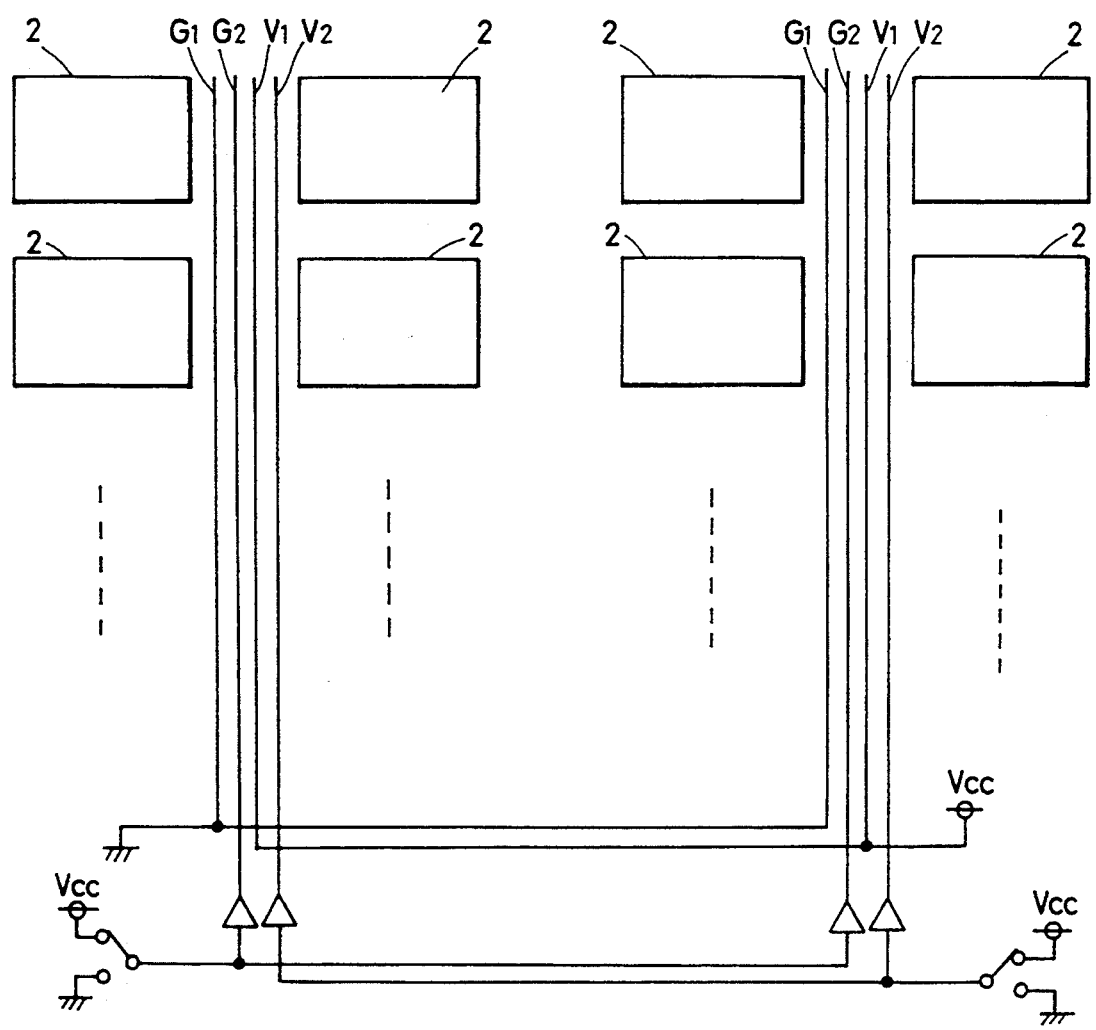
FIG. 2B is a diagram showing another example of the structure of memory cell array.

As shown in FIG. 2B, a set of a first supply line V1, a second supply line V2, a first ground line G1 and a second ground line G2 may be provided for every two columns of memory cells and is commonly used for adjacent two columns.

Figure 3:
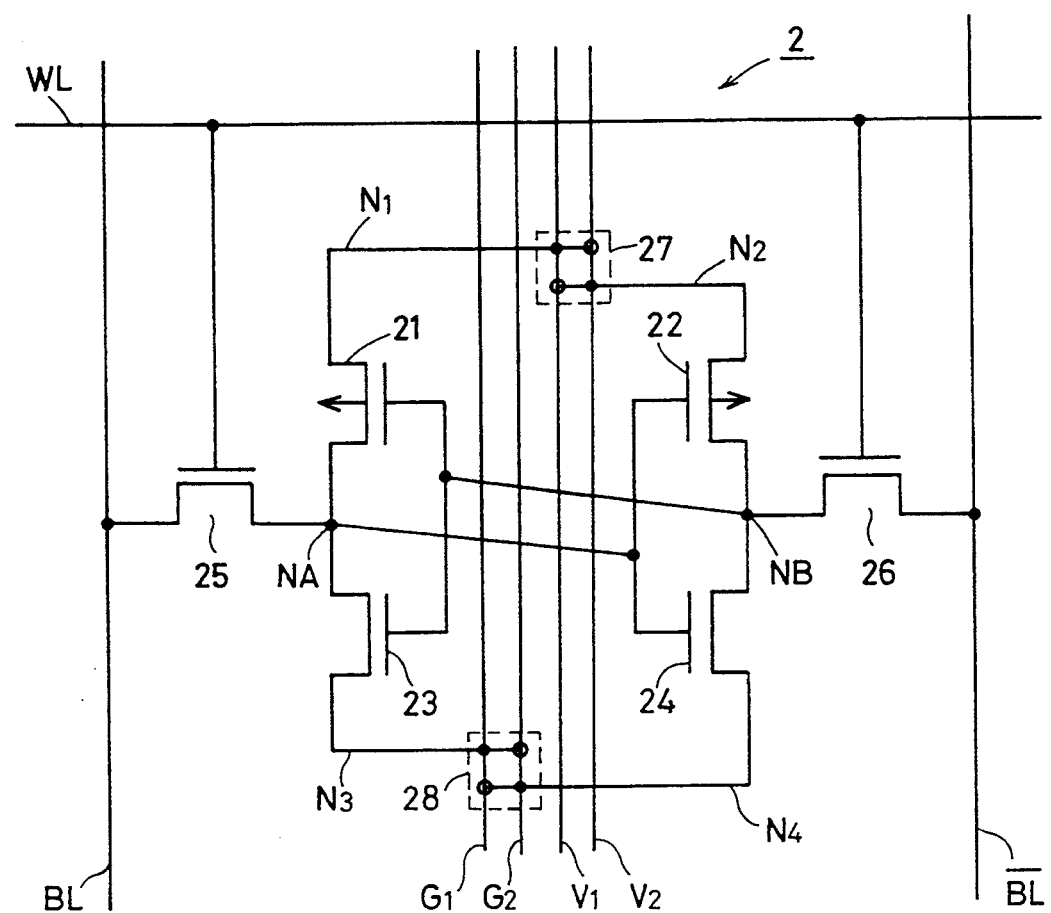
FIG. 3 is a circuit diagram showing the structure of a memory cell comprised in the first semiconductor memory device.

FIG. 3 is a circuit diagram showing the structure of the memory cell 2 shown in FIGS. 1 and 2.

Figure 17:
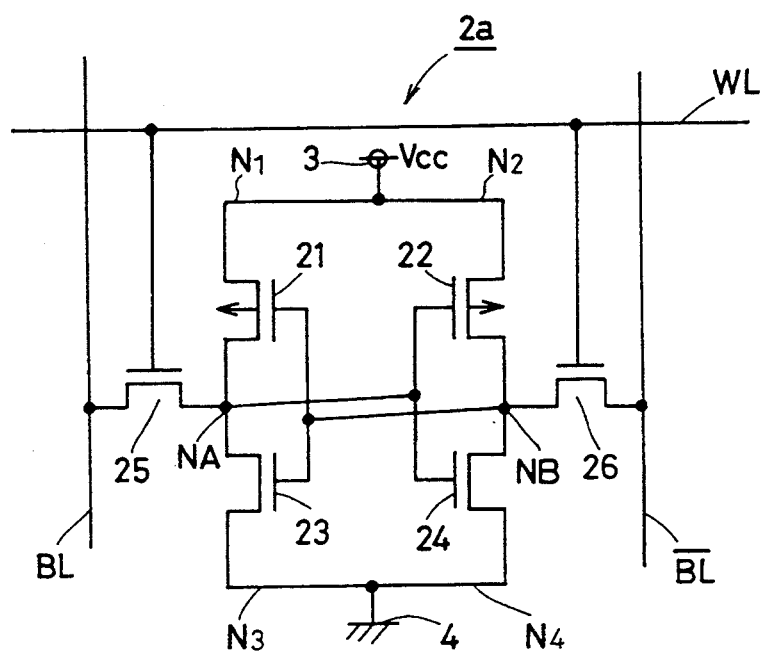
FIG. 17 is a circuit diagram showing the structure of a memory cell comprised in the semiconductor memory device in FIG. 16.
Figure 18:
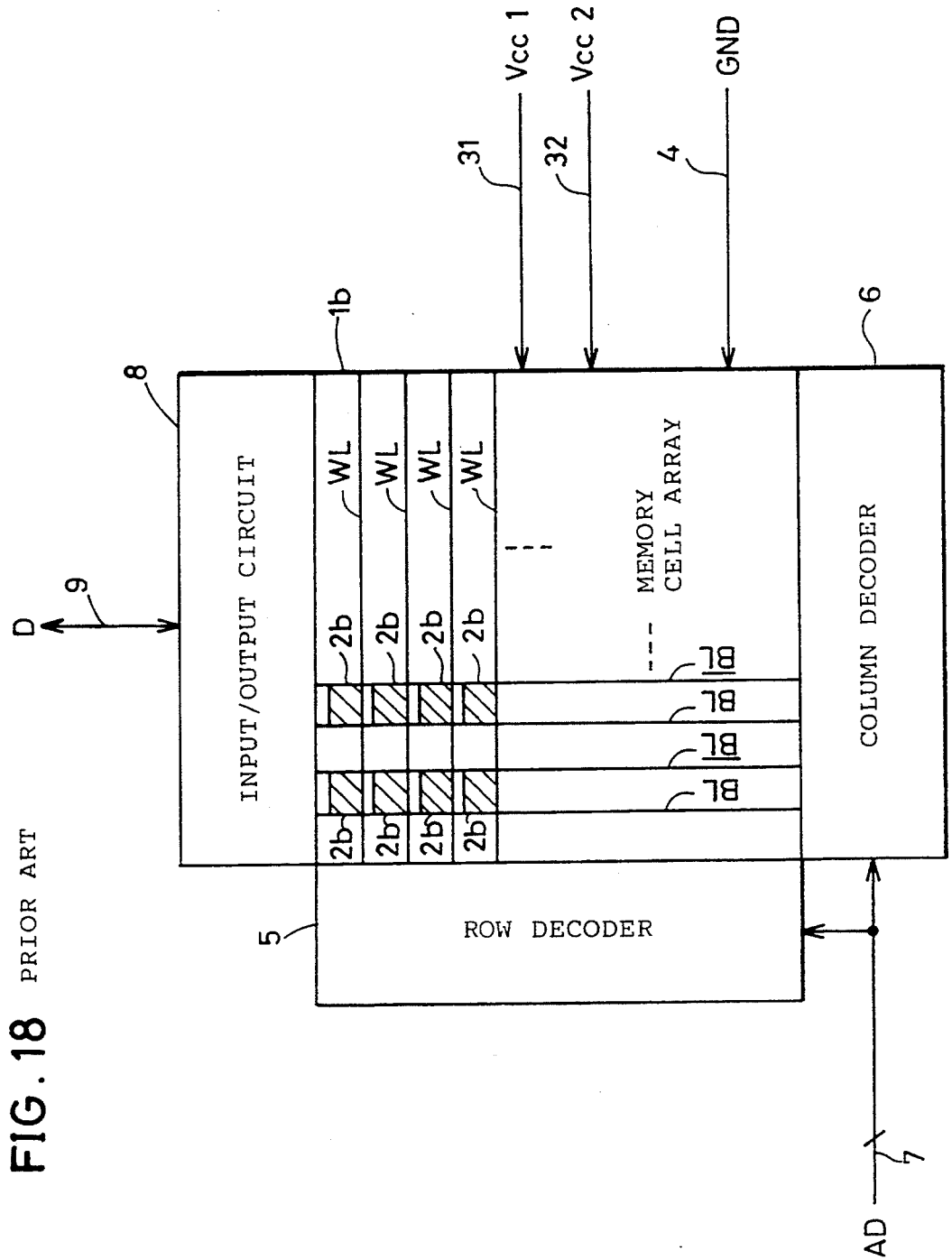
FIG. 18 is a block diagram showing another example of a conventional semiconductor memory device.
Figure 19:
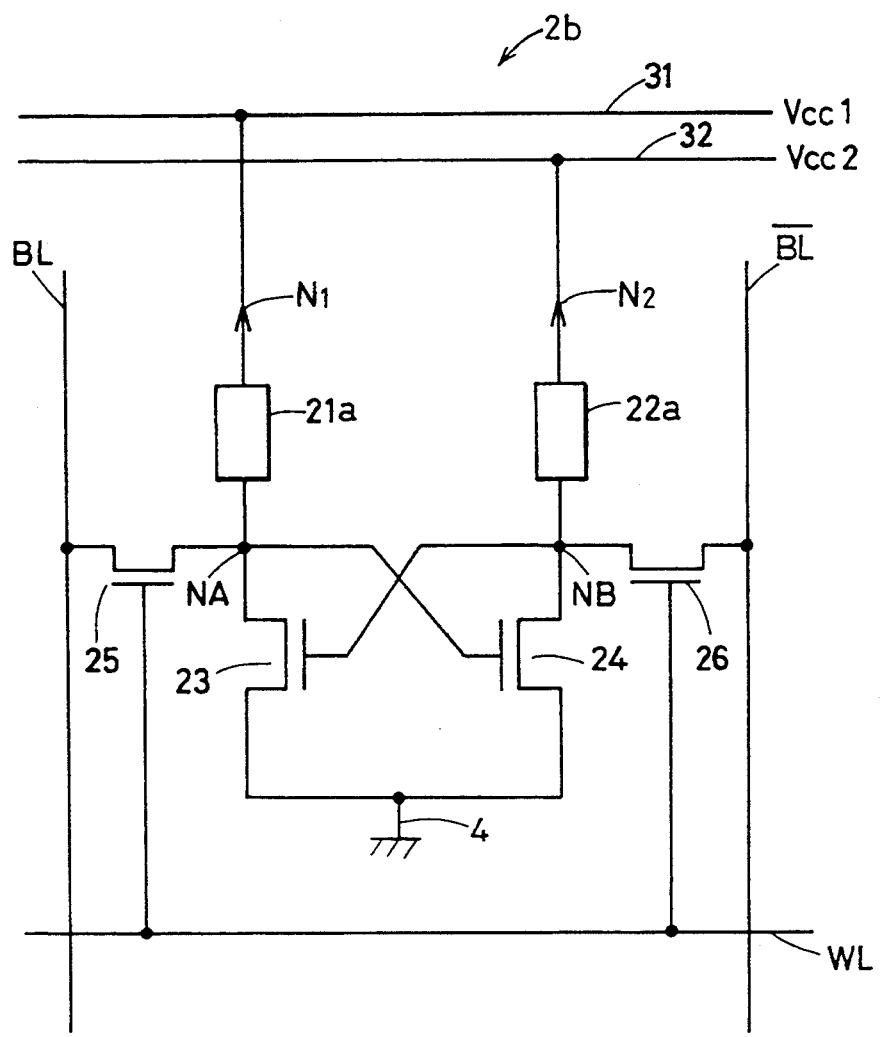
FIG. 19 is a circuit diagram showing the structure of a memory cell comprised in the semiconductor memory device in FIG. 18.

Memory cell 2 includes P channel MOS transistors 21, 22 and N channel MOS transistors 23, 24, 25, and 26 as the memory cell 2a shown in FIG. 17 does. This memory cell is also a CMOS type memory cell.

Transistor 21 corresponds to the first pull-up/pull-down means, and transistor 22 corresponds to the second pull-up/pull-down means. Transistor 23 corresponds to the third pull-up/pull-down means, and transistors 24 corresponds to the fourth pull-up/pull-down means.

Each of nodes N1, N2, is connected to either of first and second supply lines V1, V2 in a program unit 27 during the manufacturing process. Then, each of the nodes N3, N4 is connected to either of first and second ground lines G1, G2 in a program unit 28 during the manufacturing process. For example, the presence or absence of a contact, the presence or absence of a through hole, and the presence or absence of a diffusion region, and so on can change the connection of nodes N1–N4.

By this connection method (program), the type of memory cell 2 is determined to be any one of A, B, C, and D types which will be described in the following.

Now, at least one of nodes N1 and N2 needs to be connected to first supply line V1. Moreover, at least one of nodes N3 and N4 needs to be connected to first ground line G1.

Figure 4:
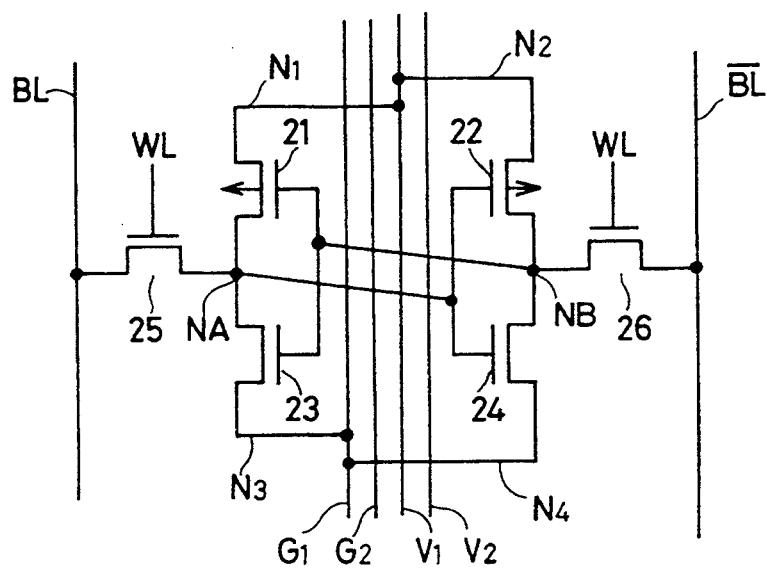
FIG. 4 is a diagram showing the connection state of an A type memory cell.
Figure 5A:
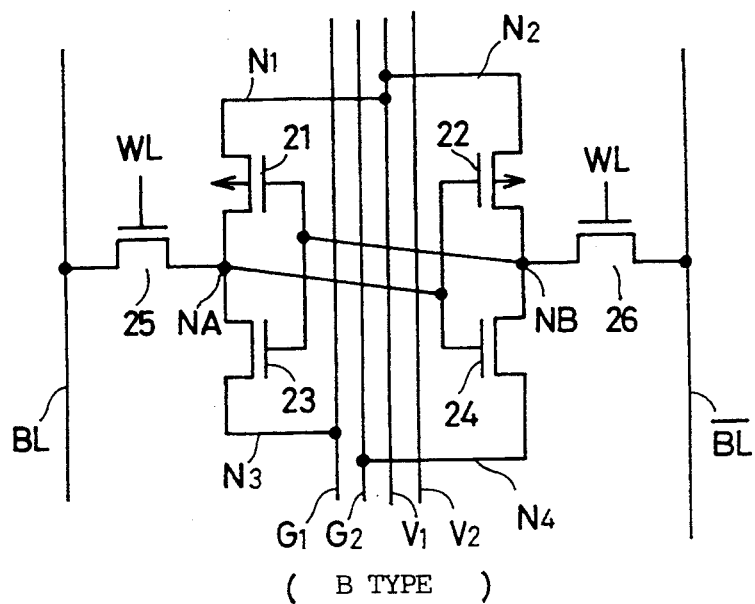
FIGS. 5A and 5B are diagrams showing the connection states of B type memory cells.
Figure 5B:
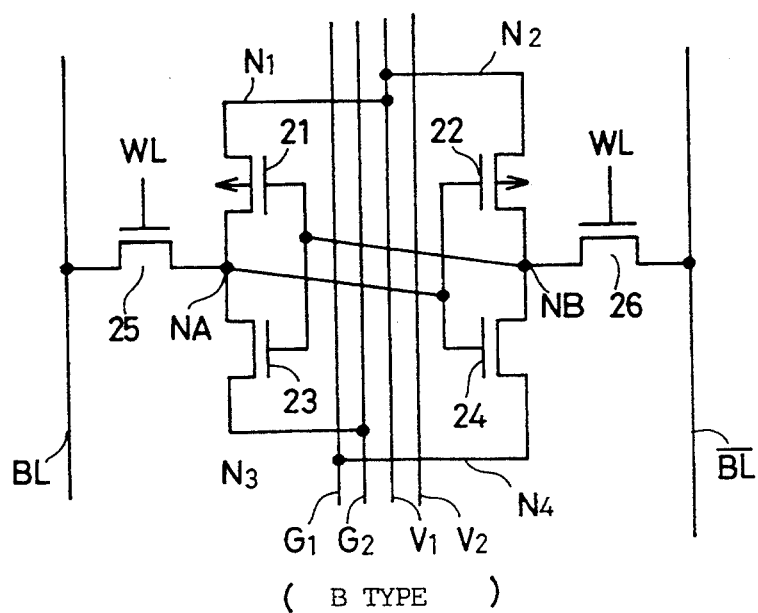
Figure 6A:
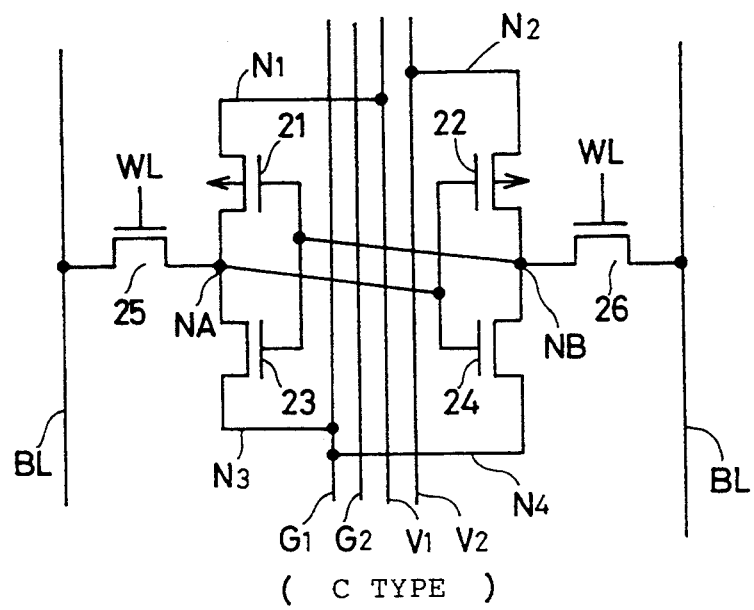
FIGS. 6A and 6B are diagrams showing the connection states of C type memory cells.
Figure 6B:
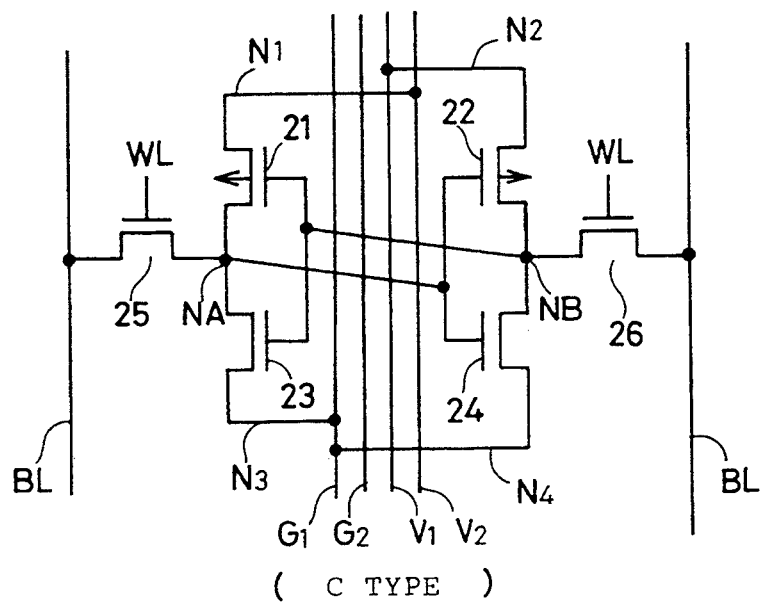

Now, with reference to FIG. 8A, the operation of memory cell 2 will be described, while the same is classified into A, B, C, and D types. FIG. 4 is a diagram showing the connection state of an A type memory cell, and FIGS. 5A and 5B are diagrams showing the connection states of B type memory cells. FIGS. 6A and 6B are diagrams showing the connection states of C type memory cells, and FIGS. 7A, 7B, 7C, and 7D are diagrams showing the connection states of D type memory cells.

(1) A type

As shown in FIG. 4, both of nodes N1 and N2 are connected to first supply line V1, and both of nodes N3 and N4 are connected to first ground line G1.

Therefore, even if any potential is supplied to second supply line V2 and second ground line G2, there is no effect on the state of this memory cell. Therefore, an A type memory cell operates as a static type memory cell which can be used for reading and writing regardless of the states of second supply line V2 and second ground line G2. Such a memory cell will be referred to as a RAM cell in the following.

(2) B type

As shown in FIGS. 5A and 5B, both of nodes N1 and N2 are connected to first supply line V1, and each of nodes N3 and N4 is connected to first ground line G1 or second ground line G2.

If a potential of "L" (ground potential GND) is supplied to second ground line G2 (the cases 1, 3), the memory cell becomes a RAM cell.

If a potential of "H" (supply potential Vcc) is supplied to second ground line G2 (the cases 2, 4), the memory cell becomes a first ROM.

Now, the operation of the memory cell in FIG. 5A in the cases 2, 4 will be described.

Assume that the memory cell stores the data "1" under the condition that the potential at word line WL is "L". In this case, the potential at node NA is "H", and the potential at node NB is "L".

If a potential of "H" is supplied to second ground line G2 under this condition, the potential at node NB is forcedly pulled up to "H", because transistor 24 is on. Therefore, the potentials at the gates of transistors 21, 23 are also forcedly pulled up to "H". As a result, transistor 21 turns off, and transistor 23 turns on. As a result, the potential at node NA is pulled down to "L". Consequently, the potential at the gate of transistor 22 becomes "L", and transistor 22 turns on. As a result, the memory cell is stabilized under the condition that the same stores the data "0".

On the other hand, assume that the memory cell stores the data "0" under the condition that the potential at word line W1 is "L". In this case, the potential at node NA is "L", and the potential at node NB is "H".

Under this condition, the potential of "H" is supplied to second ground line G2. In this case, transistor 24 is off so that the potential of node N4 does not have effect on node NB. Therefore, the memory cell is kept storing the data "0".

As described above, if the supply potential Vcc is supplied to second ground line G2, the memory cell in FIG. 5A becomes a first ROM cell fixedly storing the data "0".

Similarly, if the supply potential Vcc is supplied to second ground line G2, the memory cell in FIG. 5B becomes a first ROM cell fixedly storing the data "1".

(3) C type

As shown in FIGS. 6A and 6B, each of nodes N1 and N2 is connected to first supply line V1 or second supply line V2, and both of the nodes N3 and N4 are connected to first ground line G1.

If a potential of "H" is supplied to second supply line V2 (the cases 1, 2), the memory cell becomes a RAM cell.

If a potential of "L" is supplied to second supply line V2 (the cases 3, 4), the memory cell becomes a second ROM cell.

Now, the operation of the memory cell in FIG. 6A in the cases 3, 4 will be described.

Assume that the memory cell stores the data "0" under the condition that the potential at word line WL is "L". In this case, the potential at node NA is "L", and the potential at node NB is "H".

Under this condition, if a potential of "L" is supplied to second supply line V2, the potential node NB is forcedly pulled down to "L", because transistor 22 is on. Therefore, the potentials at the gates of transistors 21, 23 are also forcedly pulled down to "L". As a result, transistor 21 turns on, and transistor 23 turns off. Therefore, the potential at node NA is pulled up to "H". Therefore, the potential at the gate of transistor 24 becomes "H", and transistor 24 turns on. As a result, this memory cell is stabilized with the data "1" stored.

On the other hand, assume that the memory cell stores the data "1" under the condition that the potential at word line WL is a "L". In this case, the potential at node NA is of "H", and the potential at node NB is of "L".

Under this condition, a potential of "L" is supplied to second supply line V2. In this case, since transistor 22 is turned off, the potential at node N2 does not have effect on node NB. Therefore, this memory cell is kept storing the data "1".

As described above, if ground potential GND is supplied to second supply line V2, the memory cell in FIG. 6A becomes a second ROM fixedly storing the data "1".

Similarly, if ground potential GND is supplied to second supply line V2, the memory cell in FIG. 6B becomes a second ROM cell fixedly storing the data "0".

(4) D type

As shown in FIGS. 7A–7D, each of nodes N1 and N2 is connected to first supply line V1 or second supply line V2, and each of nodes N3 and N4 is connected to first ground line G1 or second ground line G2.

Figure 7A:
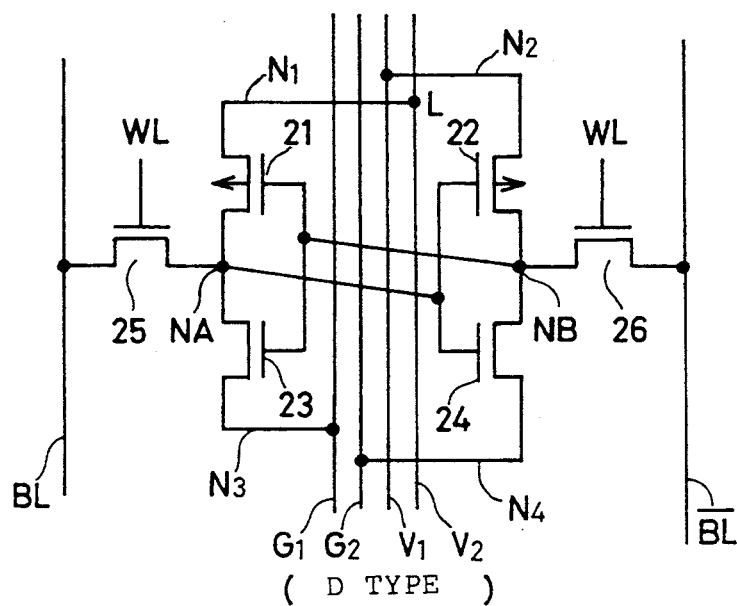
FIGS. 7A, 7B, 7C, and 7D are diagrams showing the connection states of D type memory cells.
Figure 7B:
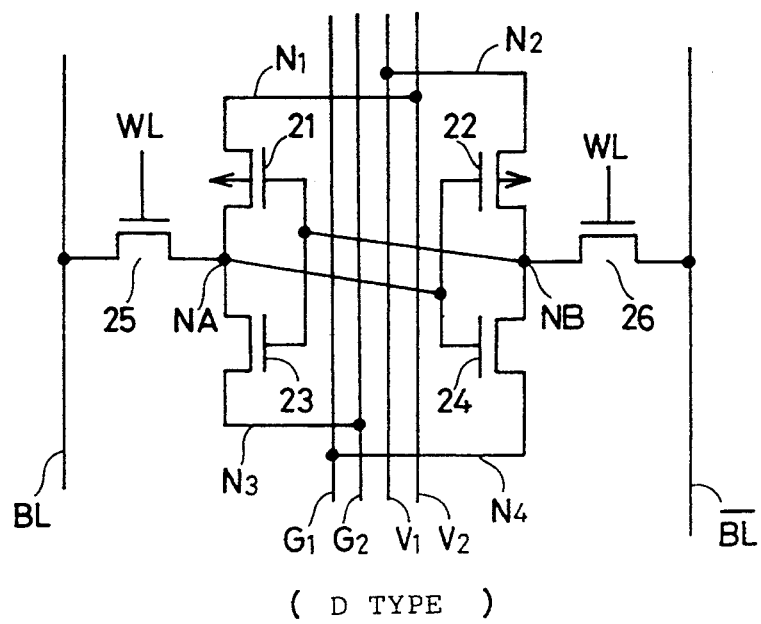
Figure 7C:
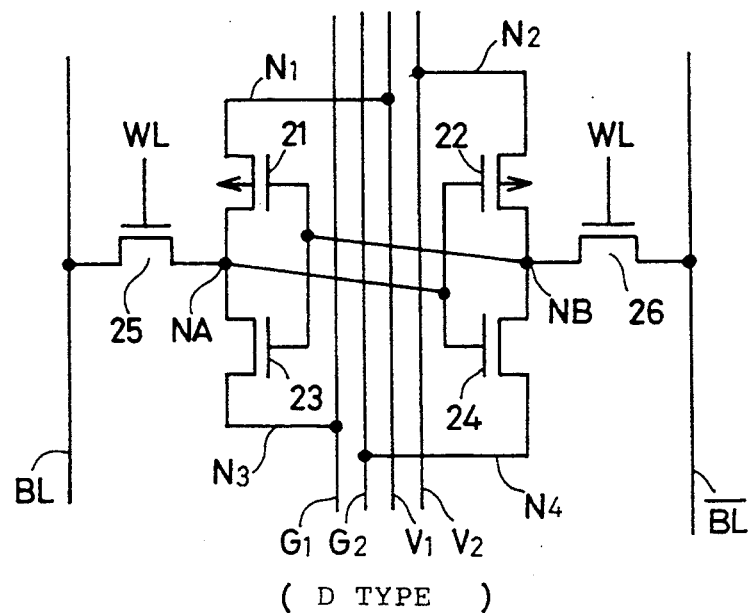
Figure 7D:
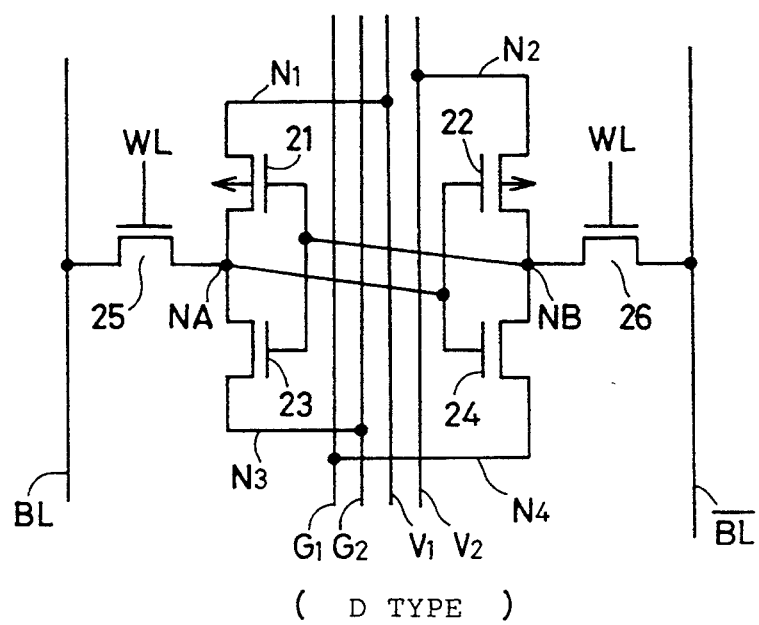

If a potential of "H" is supplied to second supply line V2, and a potential of "L" is supplied to second ground line G2 (the case 1), this memory cell becomes a RAM cell. If a potential of "H" is supplied to both of second supply line V2 and second ground line G2 (the case 2), the memory cell becomes a first ROM cell. In this case, the operation of the memory cells in FIGS. 7A and 7C is similar to the operation of B type memory cell shown in FIG. 5A. Moreover, the operation of the memory cell in FIGS. 7B and 7D is similar to the operation of the B type memory cell shown in FIG. 5B.

If a potential of "L" is supplied to both of second supply line V2 and second ground line G2 (the case 3), the memory cell operates as a second ROM cell. In this case, the operation of the memory cells in FIGS. 7A and 7B is similar to the operation of C type memory cell shown in FIG. 6B. Furthermore, the operation of the memory cell in FIGS. 7C and 7D is similar to the operation of the C type memory cell shown in FIG. 6A.

If a potential of "L" is supplied to second supply line V2 and a potential of "H" is supplied to second ground line G2 (the case 4), the operation of the memory cell is unstable depending on which voltage is supplied faster.

Figure 8E:
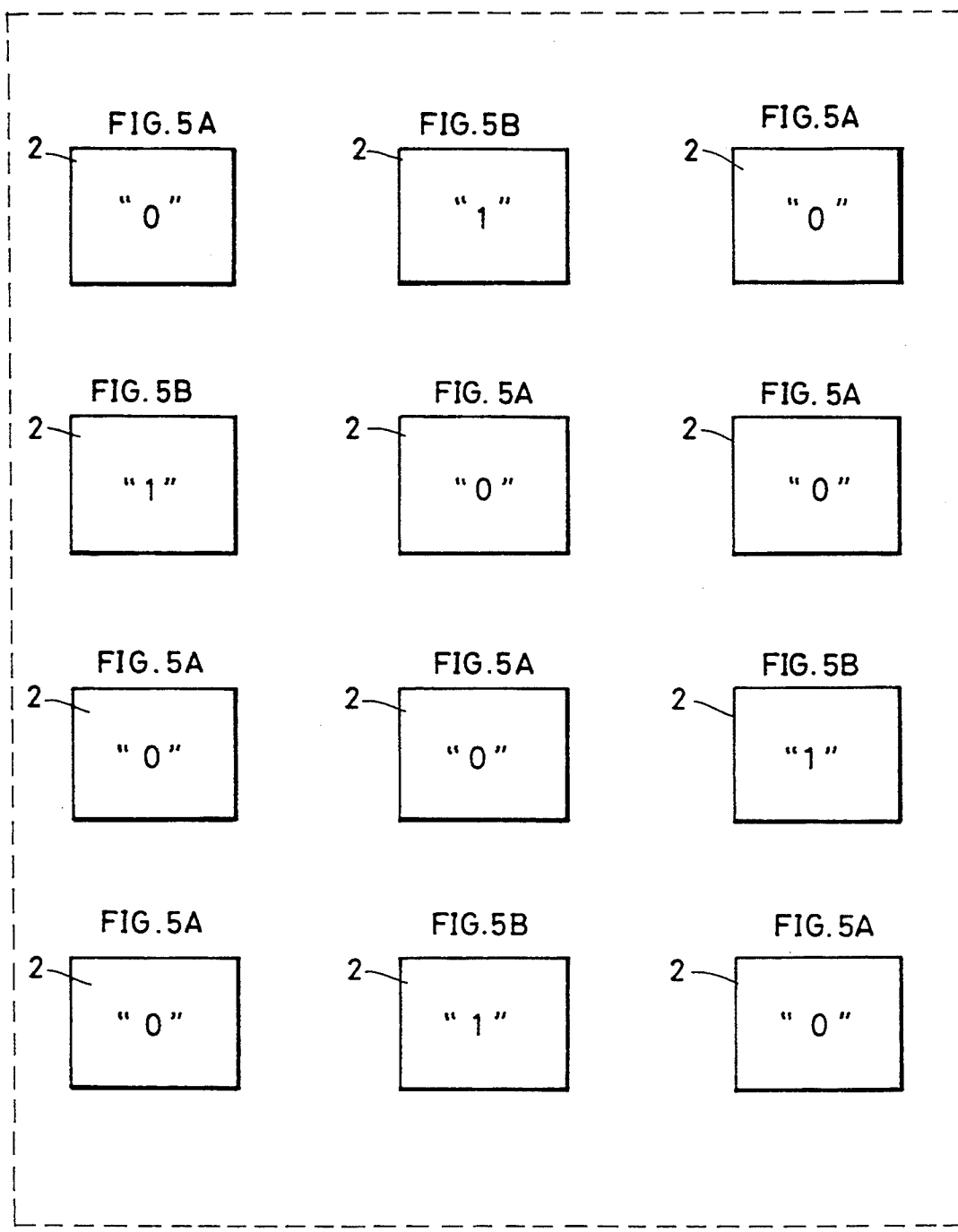
FIG. 8E shows an example of arrangement of memory cells.

As shown in FIG. 8B, when a potential of "L" is supplied to second ground line G2, B type memory cells operate as an SRAM. When a potential of "H" is supplied to second ground line G2, B type memory cells operate as a ROM. Memory cells having the connection of FIG. 5A store data of "0" and memory cells having the connection of FIG. 5B store data of "1". Therefore, for example, as shown in FIG. 8E, various data can be stored by using memory cells of FIG. 5A and memory cells of FIG. 5B.

As shown in FIG. 8C, when a potential of "H" is supplied to second supply line V2, C type memory cells operate as an SRAM. When a potential of "L" is supplied to second supply line V2, C type memory cells operate as a ROM. Memory cells having the connection of FIG. 6A store data of "1" and memory cells having the connection of FIG. 6B store data of "0".

As shown in FIG. 8D, when a potential of "H" is supplied to second supply line V2 and a potential of "L" is supplied to second ground line G2, D type memory cells operate as an SRAM. When a potential of "H" is supplied to second supply line V2 and second ground line G2, D type memory cells operate as a first ROM. Memory cells having the connections of FIGS. 7A and 7C store data of "0" and memory cells having the connections of FIGS. 7B and 7D store data of "1". When a potential of "L" is supplied to second supply line V2 and second ground line G2, D type memory cells operate as a second ROM. Memory cells having the connections of FIGS. 7A and 7B store data of "0" and memory cells having the connections of FIGS. 7C and 7D store data of "1".

Figures 9A, 9B:
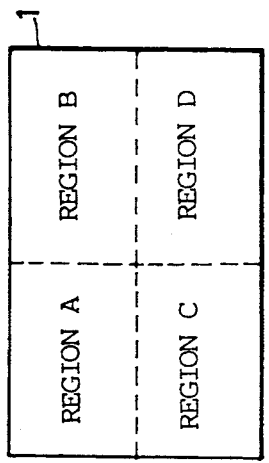
FIG. 9A is a diagram showing an example of a structure of a memory cell array using four types of memory cells.
FIG. 9B is a diagram for explaining the operation of the memory cell array in FIG. 9A.

FIG. 9A is a diagram which shows an example of the case where memory cell array 1 is constituted with memory cells of A, B, C, and D types.

A type memory cells are arranged in the left upper region A of memory cell array 1, and B type memory cells are arranged in the right upper region B, C type memory cells are arranged in the left lower region C, and D type memory cells are arranged in the right lower region D.

In FIG. 9B, the states of the memory cell array 1 in FIG. 9A in the cases 1–4 are shown.

If a potential of "H" is supplied to second supply line V2 and a potential of "L" is supplied to second ground line G2 (the case 1), all the memory cells in the regions A, B, C, and D become RAM cells. Therefore, the whole phase of memory cell array becomes a SRAM array.

If a potential of "H" is supplied to both of second supply line V2 and second ground line G2 (the case 2), the memory cells in the regions A, C become RAM cells, and the memory cells in the regions B, D become first ROM cells. Therefore, the left half region of memory cell array 1 becomes a SRAM array, and the right half region of the same becomes a first ROM array.

If a potential of "L" is provided to both of second supply line V2 and second ground line G2 (the case 3), the memory cells in the regions A, B become RAM cells, and the memory cells in the regions C, D become second ROMs. Therefore, the upper half region of memory cell array 1 becomes a SRAM array, and the lower half region of the same becomes a second ROM cell.

If a potential of "L" is supplied to second supply line and a potential of "H" is supplied to second ground line G2 (the case 4), the memory cells in the region A become RAM cells, the memory cells in the region B become first ROM cells, and the memory cells in the region C become second ROM cells. The operation of the memory cells in the region D as ROMs are not secured. Specifically, the memory cells in the region D do not function as the first ROMs nor second ROMs.

As a result, the left upper region of memory cell array 1 becomes a SRAM array, the right upper region of the same becomes a first ROM array, and the left lower region of the same becomes a second ROM array.

Thus, a user can optionally establish each region of memory cell array 1 as a SRAM or a ROM by supplying a potential of "H" or "L" to second supply line V2 and second ground line G2.

Figure 10:
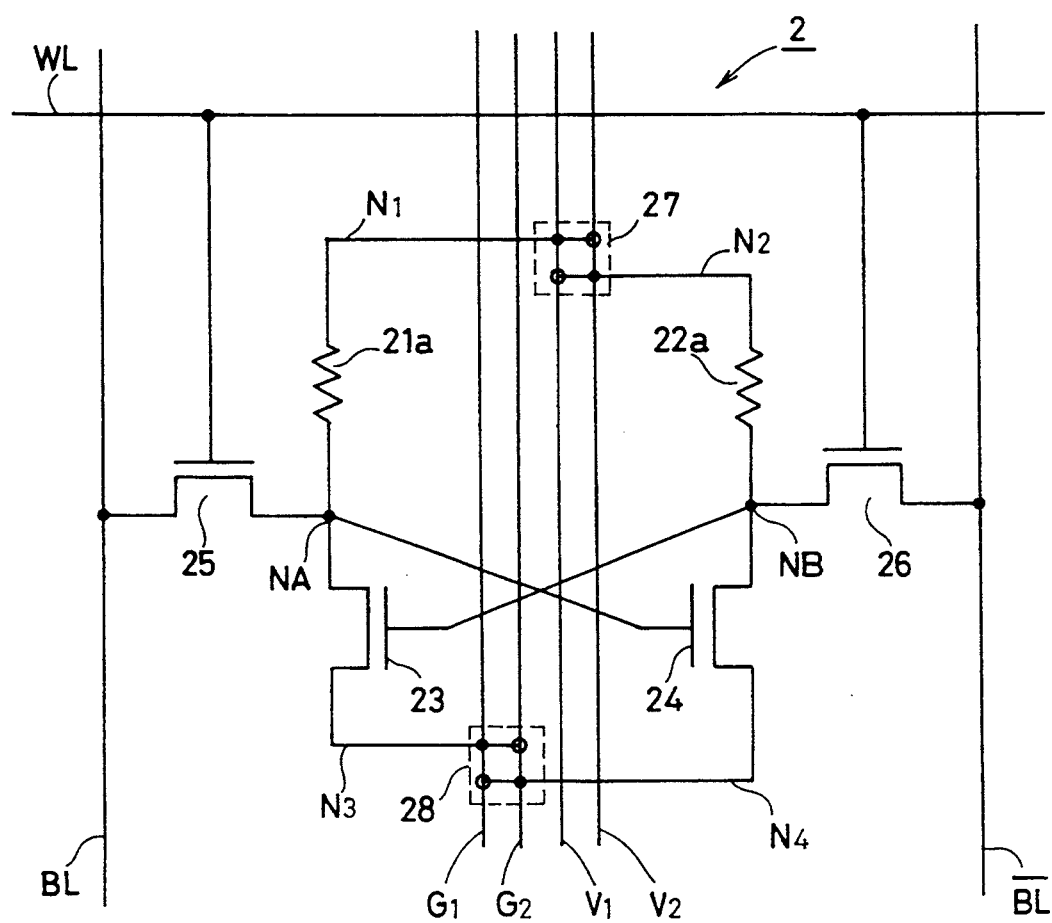
FIG. 10 is a circuit diagram showing the structure of a memory cell according to another embodiment of the invention.

FIG. 10 is a circuit diagram which shows a structure of the memory cell according to another embodiment of the invention.

The memory cell in FIG. 10 is a high resistance load type memory cell. In the memory cell in FIG. 10, high resistance devices 21a and 22a are connected instead of transistors 21, 22 in the memory cell in FIG. 3, respectively. The high resistance devices 21a, 22a, are formed of high resistance polysilicon, for example.

Figure 11:
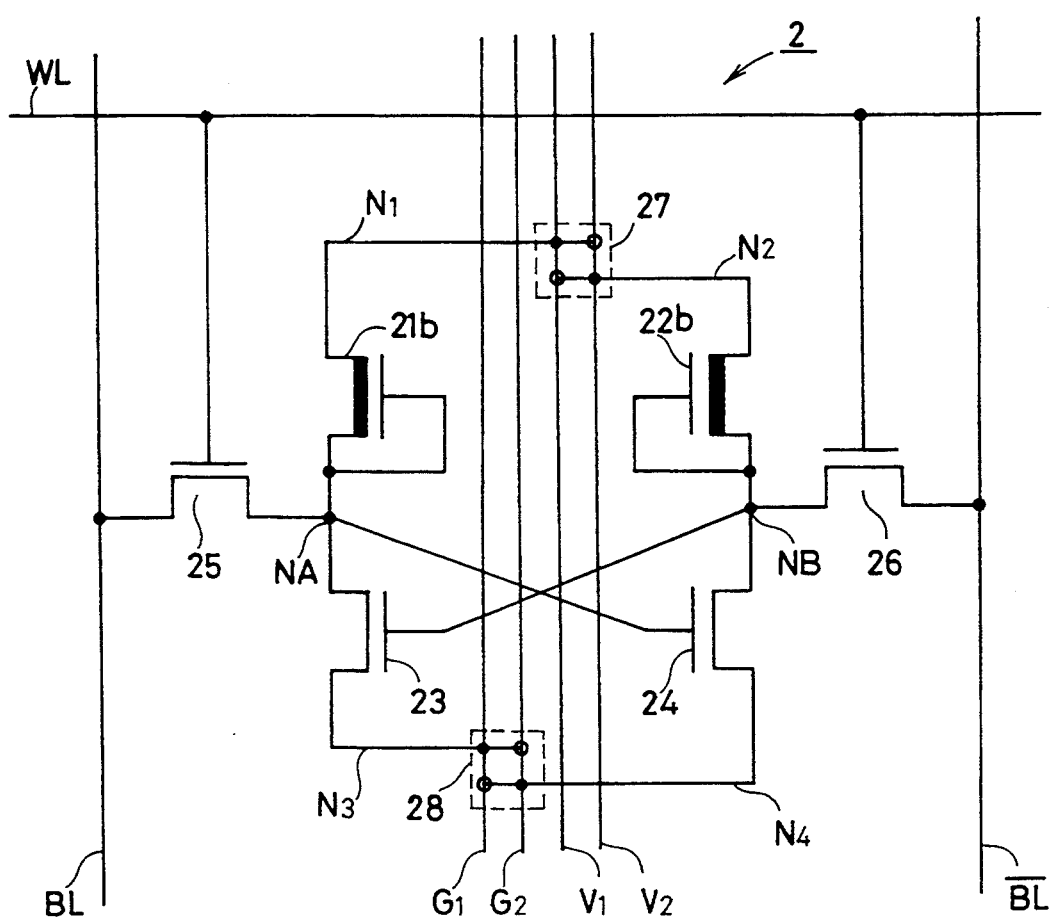
FIG. 11 is a circuit diagram showing the structure of a memory cell according to a further embodiment of the invention.

FIG. 11 is a circuit diagram which shows the structure of a memory cell according to a still another embodiment of the invention.

The memory cell in FIG. 11 is referred to as a depletion load type memory. In the memory cell in FIG. 11, depletion type N channel MOS transistors 21b, 22b are connected instead of transistor 21, 22 in the memory cell in FIG. 3, respectively. The gate of transistor 21b is connected to node NA, and the gate of the transistor 22b is connected to node NB.

Figure 12:
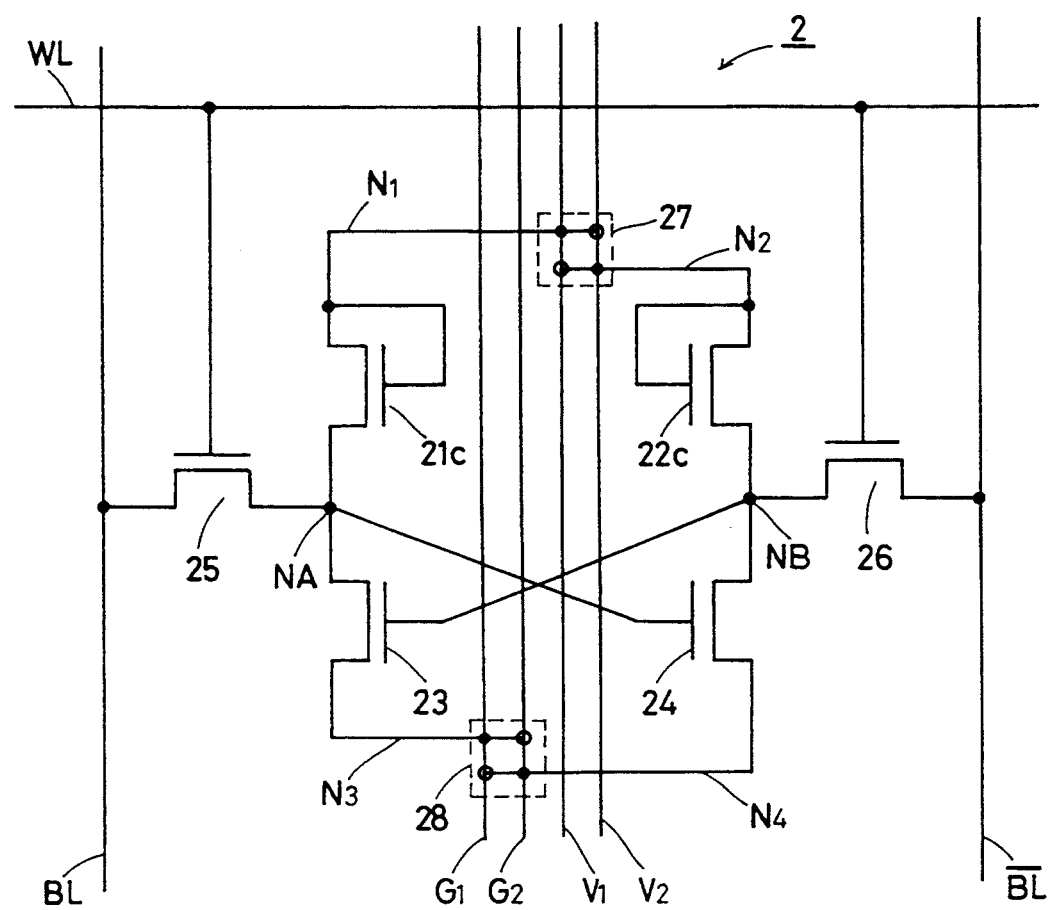
FIG. 12 is a circuit diagram showing the structure of a memory cell according to a still further embodiment of the invention.

FIG. 12 is a circuit diagram which shows a structure of the memory cell according to a further embodiment of the invention.

The memory cell in FIG. 12 is referred to as an enhancement load type memory cell. Enhancement type N channel MOS transistors 21c, 22c are connected to the memory cell in FIG. 12 instead of the depletion type N channel MOS transistors 21b, 22b in the memory cell in FIG. 11, respectively. The gate of transistor 21c is connected to node N1, and the gate of transistor 22c is connected to node N2.

Figure 13:
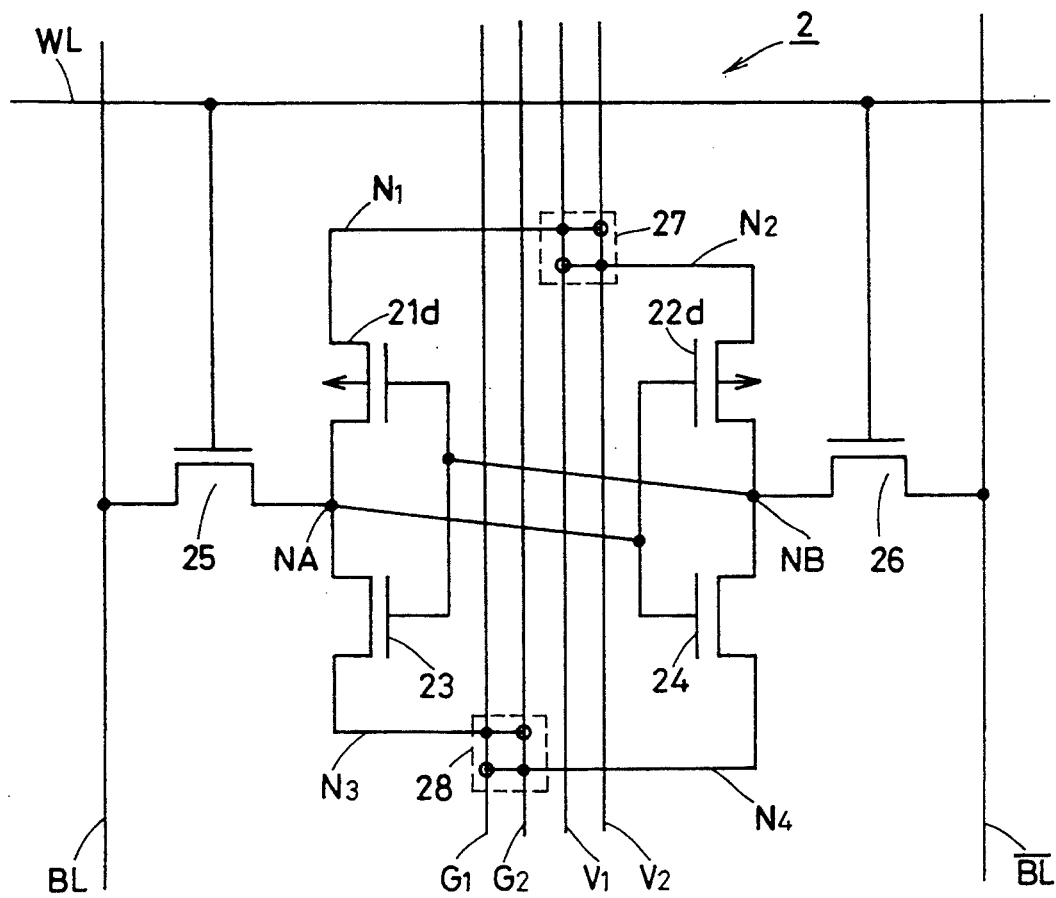
FIG. 13 is a circuit diagram showing the structure of a memory cell according to still a further embodiment of the invention.

FIG. 13 is a circuit diagram which shows a structure of the memory cell according to still a further embodiment of the invention.

The memory cell in FIG. 13 is referred to as a TFT (Thin Film Transistor) load type memory cell. In the memory cell in FIG. 13, TFT type P channel MOS transistors 21d, 22d are connected instead of transistors 21, 22 in the memory cell in FIG. 3, respectively.

The embodiments in FIGS. 10–13 bring about an effect similar to the embodiment in FIG. 3.

Figure 14:
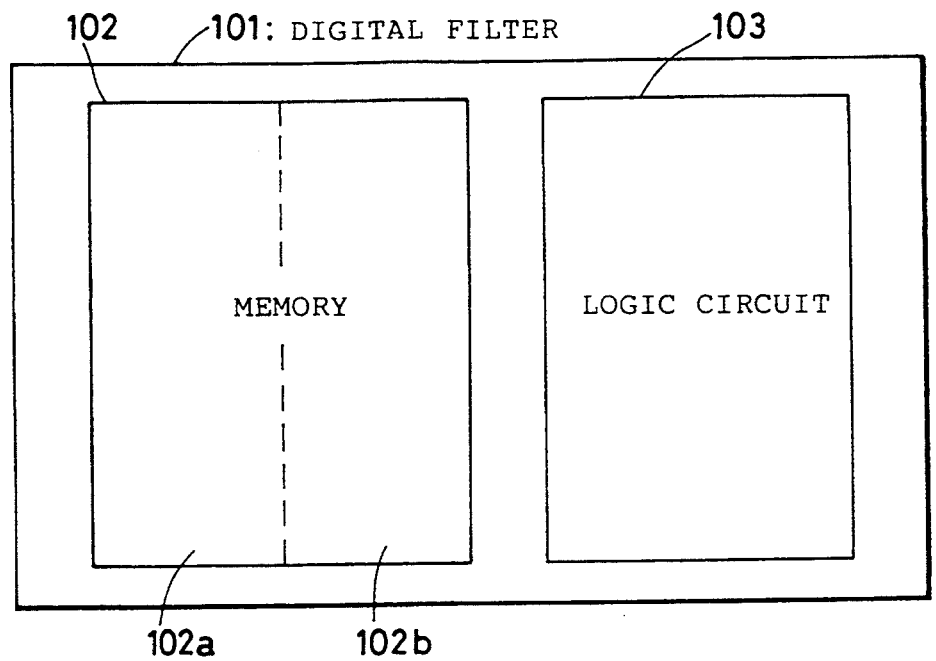
FIG. 14 is a diagram showing an example in which the semiconductor memory device of the invention is applied to a digital filter.
Figure 15:
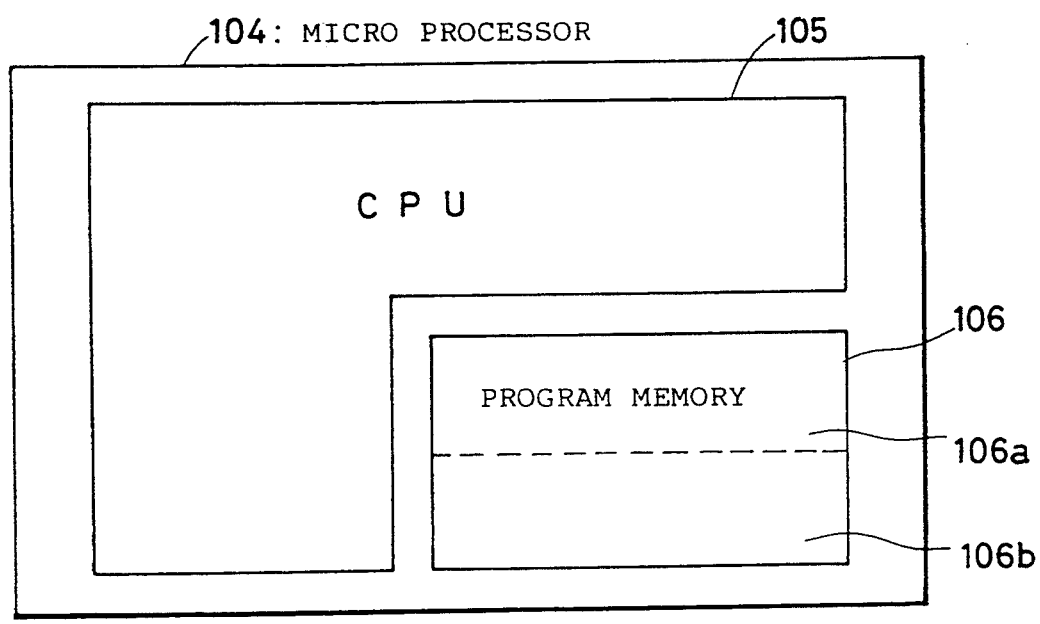
FIG. 15 is a diagram showing an example of the case where the semiconductor memory device of the invention is applied to a microprocessor.
Figure 16:
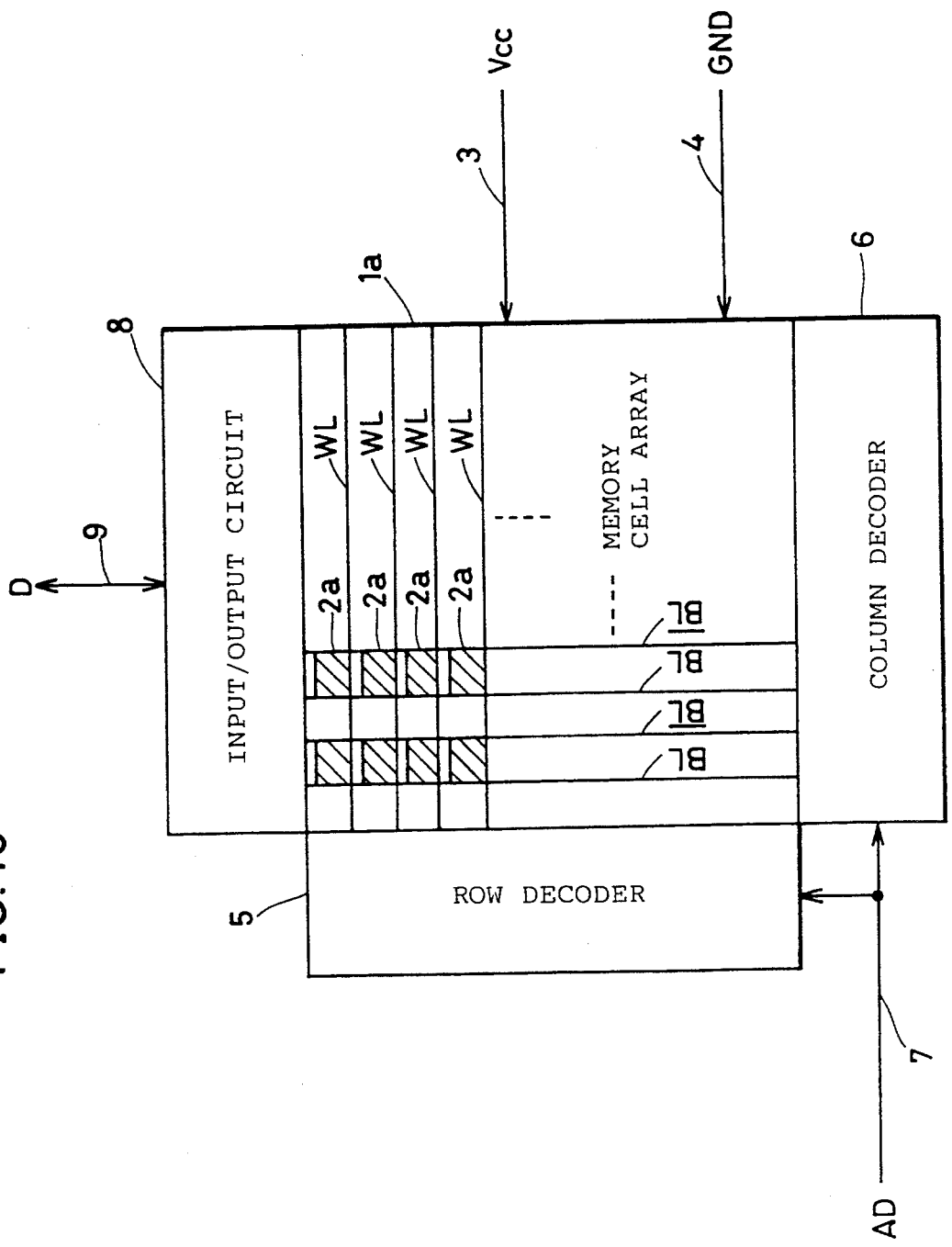
FIG. 16 is a block diagram showing an example of a conventional semiconductor memory device.

FIGS. 14 and 15 are diagrams which show an example of application of the semiconductor memory device according to the invention.

FIG. 14 shows an example in which the semiconductor memory device of the invention is applied to a digital filter 101. Digital filter 101 includes a memory 102 and a logic circuit 103. The semiconductor memory device of the invention can be used as memory 102.

A manufacturer can fixedly store a filter factor in memory 102 by making the semiconductor memory device of the invention operate as a ROM. On the other hand, a user can optionally change the filter factor stored in memory 102 by making the semiconductor memory device of the invention operate as a RAM. For example, the more significant bits of the filter factor are stored in the region 102a of memory 102, and the less significant bits of the filter factor are stored in the region 102b. In this case, a user can change only the less significant bits of the filter factor stored in the region 102b.

FIG. 15 is a diagram which shows an example of the case where the semiconductor memory device of the invention is applied to a microprocessor 104. Microprocessor 104 includes a CPU 105 and a program memory 106. The semiconductor memory device of the invention is used as program memory 106.

A program for the operation of CPU 105 is stored in the region 106a of program memory 106. A manufacturer can use the region 106b of program memory 106 as a ROM storing a test program. On the other hand, a user can use the region 106b as a RAM.

Moreover, a manufacturer can also use the region 106b as a ROM storing a particular application program. In that case, it is also possible for a user to use the region 106b as a RAM.

Furthermore, application of the semiconductor memory device of the invention is not limited to the above described examples, and it is applicable to various uses.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a first potential line for receiving a first potential;
   a second potential line for receiving a second potential;
   a third potential line for selectively receiving the first potential or the second potential;
   a fourth potential line for selectively receiving the first potential or the second potential; and at least one memory cell; said memory cell including:
   a first node and a second node provided with potentials which are complementary to each other;
   first pull-up/pull-down means connected between either of said first and third potential lines and said first node;
   second pull-up/pull-down means connected between either of said first and third potential lines and said second node,
   third pull-up/pull-down means connected between either of said second and fourth potential lines and said first node; and
   fourth pull-up/pull-down means connected between either of said second and fourth potential lines and said second node.

2. The semiconductor memory device according to claim 1, wherein
   said first pull-up/pull-down means includes first conductive channel transistor means having a gate connected to said second node;
   said second pull-up/pull-down means includes first conductive channel transistor means having a gate connected to said first node;
   said third pull-up/pull-down means includes second conductive channel transistor means having a gate connected to said second node; and
   said fourth pull-up/pull-down means includes second conductive channel transistor means having a gate connected to said first node.

3. The semiconductor memory device according to claim 2, wherein
   said first conductive channel transistor means includes a P channel MOS transistor; and
   said second conductive channel transistor means includes a N channel MOS transistor.

4. The semiconductor memory device according to claim 1, wherein
   said first pull-up/pull-down means includes high resistance means;
   said second pull-up/pull-down means includes high resistance means;
   said third pull-up/pull-down means includes transistor means having a gate connected to said second node;
   said fourth pull-up/pull-down means includes transistor means having a gate connected to said first node.

5. The semiconductor memory device according to claim 4, wherein
   said high resistance means is formed of high resistance polysilicon; and
   said transistor means includes a N channel MOS transistor.

6. The semiconductor memory device according to claim 1, wherein
   said first pull-up/pull-down means includes first depletion type transistor means having a gate connected to said first node;
   said second pull-up/pull-down means includes second depletion type transistor means having a gate connected to said second node;
   said third pull-up/pull-down means includes third transistor means having a gate connected to said second node; and
   said fourth pull-up/pull-down means includes fourth transistor means having a gate connected to said first node.

7. The semiconductor memory device according to claim 6, wherein
   each of said first and second depletion type transistor means includes a depletion type N channel MOS transistor; and
   each of said third and fourth transistor means includes a N channel MOS transistor.

8. The semiconductor memory device according to claim 1, wherein
   said first pull-up/pull-down means includes first enhancement type transistor means having a gate connected to either of said first and third potential lines;
   said second pull-up/pull-down means includes second enhancement type transistor means having a gate connected to either of said first and third potential lines;
   said third pull-up/pull-down means includes third transistor means having a gate connected to said second node;
   said fourth pull-up/pull-down means includes fourth transistor means having a gate connected to said first node.

9. The semiconductor memory device according to claim 8, wherein
   each of said first and second enhancement type transistor means includes an enhancement type N channel MOS transistor; and
   each of said third and fourth transistor means includes a N channel MOS transistor.

10. The semiconductor memory device according to claim 1, wherein said first pull-up/pull-down means includes first TFT type first conductive channel transistor means having a gate connected to said second node;

said second pull-up/pull-down means includes second TFT type first conductive channel transistor means having a gate connected to said first node;

said third pull-up/pull-down means includes second conductive channel transistor means having a gate connected to said second node; and said fourth pull-up/pull-down means includes second conductive channel MOS transistor means having a gate connected to said first node.

11. The semiconductor memory device according to claim 10, wherein each of said TFT type first conductive channel transistor means includes a TFT type P channel MOS transistor; and each of said second conductive channel transistor means includes N channel MOS transistor.

12. The semiconductor memory device according to claim 1, further comprising:

a first program means capable of preconnecting each of said first and second pull-up/pull-down means to either of said first and third potential lines; and a second program means capable of preconnecting each of said third and fourth pull-up/pull-down means to either of said second and fourth potential line.

13. The semiconductor memory device according to claim 12, wherein each of said first and second program means determines the connection state, depending on the presence or absence of a contact.

14. The semiconductor memory device according to claim 12, wherein each of said first and second program means determines the connection state, depending on the presence or absence of a through hole.

15. The semiconductor memory device according to claim 12, wherein each of said first and second program means determines the connection state, depending on the presence or absence of a diffusion region.

16. The semiconductor memory device according to claim 1, wherein said first potential corresponds to the supply potential;

said second potential corresponds to the ground potential.

17. A semiconductor memory device comprising:

a plurality of word lines;

a plurality of bit line pair each comprising a first bit line and a second bit line and arranged so as to cross said plurality of word lines;

a first potential line for receiving a first potential;

a second potential line for receiving a second potential;

a third potential line for selectively receiving the first potential or the second potential;

a fourth potential line for selectively receiving the first potential or the second potential; and a plurality of memory cells provided at the crossings of said plurality of word lines and plurality of bit line pairs each of said plurality of memory cells including;

a first node and a second node provided with potentials which are complementary to each other;

first pull-up/pull-down means connected between either of said first and third potential lines and said first node;

second pull-up/pull-down means connected between either of said first and third potential lines and said second node;

third pull-up/pull-down means connected between either of said second and fourth potential lines and said first node; and fourth pull-up/pull-down means connected to either of said second and fourth potential lines and said second node.

18. A method of operating a semiconductor memory device comprising a first node and a second node provided with potentials (which are) complementary to each other, first pull-up/pull-down means connected between either of first and third potential lines and said first node, second pull-up/pull-down means connected between either of said first and third potential lines and said second node, third pull-up/pull-down means connected between either of the second and fourth potential lines and said first node, and fourth pull-up/pull-down means connected between either of said second and fourth potential lines and said second node, said method comprising the steps of:

providing a first potential to said first potential line;

providing a second potential to said second potential line;

selectively providing the first potential or the second potential to said third potential line; and selectively providing the first potential or the second potential to said fourth potential line.

19. A semiconductor memory device comprising:

at least one memory cell having switching transistors in two circuit portions, each circuit portion including an input node and an output node, each input node connected to the output node of the other circuit portion to define a cross coupling, the two output nodes having complementary digital voltage levels, one of said output nodes forming a memory cell output indicative of stored cell information, each circuit portion further including a first and a second terminal; and voltage applying means for selectively applying a voltage of either a high digital level or low digital level to each of said first and second terminals, whereby said memory cell may operate selectively as a SRAM cell, a ROM cell having a high digital level storage or as a ROM cell having a low digital level storage.

20. A semiconductor memory device comprising:

at least one memory cell having switching transistors in two circuit portions, each circuit portion including an input node and an output node, each input node connected to the output node of the other circuit portion to define a cross coupling, the two output nodes having complementary digital voltage levels, one of said output nodes forming a memory cell output indicative of stored cell information, each circuit portion further including a first and a second terminal; and voltage applying means for selectively applying a voltage of either a high digital level or a low digital level to each of said first and second terminals, whereby said memory cell may operate selectively as a SRAM cell, a ROM cell having a high digital level storage or as a ROM cell having a low digital level storage, wherein said voltage applying means comprises:

a high voltage level reference source, a low voltage level reference source; and four conductive lines respectively connected to the first and second terminals of the two circuit portions, a first one of said conductive lines being supplied with said high voltage level reference source, a second one of said conductive lines being supplied with said low voltage level reference source, and the remaining conductive lines being independently selectively supplied with one of said high and low voltage level reference sources.

21. A semiconductor memory device as recited in claim 20, wherein said first terminals in said two circuit portions are connected to said first one of said conductive lines, one of said second terminals in said two circuit portions is connected to one of said remaining conductive lines, and the other of said second terminals in said two circuit portions is connected to said second one of said conductive lines.

22. A semiconductor memory device as recited in claim 20, wherein one of said first terminals in said two circuit portions is connected to one of said remaining conductive lines, the other of said first terminals in said two circuit portions is connected to said first one of said conductive lines, and said second terminals in said two circuit portions are connected to said second one of said conductive lines.

23. A semiconductor memory device as recited in claim 20, wherein one of said first terminals in said two circuit portions is connected to a first one of said remaining conductive lines having voltage selectively applied thereto and one of said second terminals of said two circuit portions is connected to a second one of said remaining conductive lines having voltage applied thereto.

24. A semiconductor memory device comprising:
a plurality of memory cells arranged in an array of rows and columns, each memory cell having switching transistors in two circuit portions, each circuit portion including an input node and an output node, each input node connected to the output node of the other circuit portion to define a cross coupling, the two output nodes having complementary digital voltage levels, one of said output nodes forming a memory cell output indicative of stored cell information, each circuit portion further including a first and a second terminal;
a plurality of parallel conductive lines extending along each column, the first and second terminals of said two circuit portions of each memory cell in each column connected to individual ones of said conductive lines corresponding thereto; and
voltage applying means for selectively applying a voltage of either a high digital level or a low digital level to at least two of said conductive lines corresponding to each column, whereby said memory cells may operate selectively as SRAM cells, ROM cells having a high digital level storage or as ROM cells having a low digital level storage.

25. A semiconductor memory device comprising:
a plurality of word lines and a plurality of bit lines crossing said plurality of word lines;
a plurality of memory cells arranged in an array of rows and columns at crossing points of said plurality of word lines and said plurality of bit lines, each memory cell having switching transistors forming a latch circuit;
a plurality of parallel conductive lines extending along each column, crossing said plurality of word lines, for selecting connection to the memory cells in the respective column; and
voltage applying means for selectively applying a voltage of either high digital level or low digital level to at least two of said plurality of conductive lines corresponding to each columns, whereby said memory cells may operate selectively as SRAM cells, ROM cells having a high digital level storage or as ROM cells having a low digital level storage.

26. A semiconductor memory device comprising:
a plurality of word lines and a plurality of bit lines crossing said plurality of word lines;
a plurality of memory cells arranged in an array of rows and columns, each memory cell having an array of rows and columns, each memory cell having switching transistors forming a latch circuit;
a plurality of parallel conductive lines arranged for every two columns, crossing said plurality of word lines, and for selective connection to the memory cells in the respective adjacent two columns; and
voltage applying means for selectively applying a voltage of either high digital level or low digital level to at least two of said plurality of parallel conductive lines corresponding to each columns, whereby said memory cells may operate selectively as SRAM cells, ROM cells having a high digital level storage or as ROM cells having a low digital level storage.

27. A semiconductor memory device comprising:
at least one memory cell,
first line supplied with a voltage of low digital level,
second line selectively supplied with one of voltages of high and low digital levels,
third lines supplied with a voltage of high digital level, and
fourth line selectively supplied with one of voltages of high and low digital levels,
said memory cell comprising
first and second storage nodes,
a first MOS transistor connected between said first storage node and selected one of said first and second lines and having a gate electrode connected to said second storage node,
a second MOS transistor connected between said second storage node and selected one of said first and second lines and having a gate electrode connected to said first storage node,
a first element having a first node connected to selected one of said third and fourth lines and a second node connected to said first storage node, and
a second element having a first node connected to selected one of said third and fourth lines and a second node connected to said second storage node.

* * * * *